(12) United States Patent
Asanuma et al.

(10) Patent No.: US 9,929,679 B2
(45) Date of Patent: Mar. 27, 2018

(54) ELECTROSTATIC INDUCTION-TYPE VIBRATION POWER GENERATION DEVICE AND METHOD OF MANUFACTURING THE SAME

(71) Applicant: SENDAI SMART MACHINES CO., LTD., Sendai-shi, Miyagi (JP)

(72) Inventors: Haruhiko Asanuma, Sendai (JP); Hiroyuki Oguchi, Sendai (JP); Motoaki Hara, Sendai (JP); Hiroki Kuwano, Sendai (JP)

(73) Assignee: SENDAI SMART MACHINES CO., LTD., Sendai-shi (JP)

( * ) Notice: Subject to any disclaimer, the term of this patent is extended or adjusted under 35 U.S.C. 154(b) by 281 days.

(21) Appl. No.: 14/777,779

(22) PCT Filed: Mar. 14, 2014

(86) PCT No.: PCT/JP2014/056847
§ 371 (c)(1),
(2) Date: Sep. 17, 2015

(87) PCT Pub. No.: WO2014/148371
PCT Pub. Date: Sep. 25, 2014

(65) Prior Publication Data
US 2016/0285391 A1    Sep. 29, 2016

(30) Foreign Application Priority Data
Mar. 19, 2013 (JP) .................................. 2013-056003

(51) Int. Cl.
*H02N 11/00* (2006.01)
*H02N 1/08* (2006.01)
(Continued)

(52) U.S. Cl.
CPC ............... *H02N 1/08* (2013.01); *H01L 37/02* (2013.01); *H01L 41/22* (2013.01); *H02N 2/18* (2013.01)

(58) Field of Classification Search
CPC .. H02N 1/00; H02N 1/08; H02N 2/18; H02N 2/186; H02N 2/188; H01L 37/02; H01L 41/22
(Continued)

(56) References Cited

U.S. PATENT DOCUMENTS 3,652,932 A * 3/1972 Sessler .................. G01N 27/60
                                                    29/592.1
3,786,495 A * 1/1974 Spence .................. H04R 19/01
                                                    257/417
(Continued)

FOREIGN PATENT DOCUMENTS

JP      H05-64463 A      3/1993
JP      2003-153557 A    5/2003
(Continued)

OTHER PUBLICATIONS

T.Suzuki et al. "Novel vibration-driven micro-electrostatic induction energy harvester with asymmetric multi-resonant spring" IEEE Sensors Conference 2010, pp. 1161-1164, DOI: 10.1109/ICSENS.2010.5690694.*
(Continued)

*Primary Examiner* — Burton Mullins
(74) *Attorney, Agent, or Firm* — Oliff PLC

(57) ABSTRACT

An electrostatic induction-type vibration power generation device and method for improving a power generation amount, and extracting an external electric field from a spontaneous polarization electret. A pair of conductive plates is disposed with a gap therebetween. A charged body formed of a spontaneous polarization electret having prede-
(Continued)

termined thickness has a positively charged lower surface and negatively charged upper surface. The charged body is between conductive plates in contact with one conductive plate. The gap between the conductive plates is displaced in a direction vertical to the surfaces of the spontaneous polarization electret, whereby an electrostatic capacitance changes and electric power is generated. The other conductive plate is disposed at a position where an absolute value of an external electric field emitted outside from the charged body is between $2.7 \times 10^7$ V/m and $1.5 \times 10^{10}$ V/m. Moreover, the thickness of the spontaneous polarization electret is between 1 mm and 60 mm.

7 Claims, 10 Drawing Sheets

(51) Int. Cl.
*H01L 37/02* (2006.01)
*H01L 41/22* (2013.01)
*H02N 2/18* (2006.01)

(58) Field of Classification Search
USPC .......................... 310/300, 308–309; 307/400
See application file for complete search history.

(56) References Cited

U.S. PATENT DOCUMENTS

| | | | | |
|---|---|---|---|---|
| 7,211,923 B2* | 5/2007 | Potter | ...................... | H02N 1/08 310/309 |
| 7,449,811 B2* | 11/2008 | Suzuki | .................. | H01G 7/023 310/309 |
| 7,804,205 B2* | 9/2010 | Murayama | ........... | H01G 5/0136 257/651 |
| 8,129,869 B2* | 3/2012 | Kashiwagi | ............. | H01G 7/023 204/165 |
| 8,212,433 B2* | 7/2012 | Kashiwagi | ............... | H01G 7/02 307/400 |
| 8,265,287 B2* | 9/2012 | Kageyama | ............. | G01H 11/06 381/174 |
| 8,304,958 B2* | 11/2012 | Aoyagi | .................... | H02N 1/08 310/309 |
| 9,413,272 B2* | 8/2016 | Aoyagi | .................... | H01G 7/02 |
| 2009/0174281 A1* | 7/2009 | Lo | ............................ | H02N 1/08 310/300 |
| 2013/0057110 A1* | 3/2013 | Aoyagi | .................... | H01G 7/02 310/300 |

FOREIGN PATENT DOCUMENTS

| | | | | |
|---|---|---|---|---|
| JP | 2005-529574 A | | 9/2005 | |
| JP | 2007-298297 A | | 11/2007 | |
| JP | 2008-053527 | * | 3/2008 | ............. H01L 41/08 |
| JP | 2009-232615 A | | 10/2009 | |
| JP | 2011-045194 A | | 3/2011 | |
| JP | 2011-165846 A | | 8/2011 | |
| JP | 2012-120388 A | | 6/2012 | |
| JP | 2012-152010 A | | 8/2012 | |
| JP | 2012-200132 A | | 10/2012 | |
| JP | 2012-205465 A | | 10/2012 | |
| WO | 03/105167 A2 | | 12/2003 | |

OTHER PUBLICATIONS

Jun. 17, 2014 International Search Report issued in International Patent Application No. PCT/JP2014/056847.

* cited by examiner (a)

(b)

(c)

(d)

(a)

(b)

(c)

(d)

ELECTROSTATIC INDUCTION-TYPE VIBRATION POWER GENERATION DEVICE AND METHOD OF MANUFACTURING THE SAME

TECHNICAL FIELD

The present invention relates to an electrostatic induction-type vibration power generation device and a method of manufacturing the same.

BACKGROUND ART

In recent years, electrostatic induction-type vibration power generation devices which use a charged body called an electret have been actively developed. This device includes an electret and electrodes provided so as to face a charged surface of the electret. This device forms an electrostatic capacitance when an external electric field emitted from the charged surface of the electret induces electric charges on the counter electrodes. When a relative position between the electret and the electrodes is changed by an external force in this device, the electrostatic capacitance changes and an electric current is created in a load connected thereto. Thus, electric power can be obtained (for example, see Patent Literatures 1 to 3).

When this vibration power generation device is used as a driving source of a small sensor, for example, it is possible to shorten a sensing interval and to reduce the size of the module by improving the power generation amount. As a means of improving the power generation amount of the vibration power generation device, a method of obtaining a larger surface charge density than conventional corona discharge methods disclosed in Patent Literatures 1 to 3 is proposed (for example, see Patent Literature 4). In this method, a spontaneous polarization of monocrystalline zinc oxide is used as an electret by focusing on the fact that the power generation amount is proportional to the square of a surface charge density of a charged body. Based on the same reasons, as a means of obtaining a high surface charge density, a method of using a ferroelectric substance having high crystalline orientation as an electret is proposed (for example, see Patent Literature 5). Further, a method of manufacturing an electret formed of a ferroelectric material, for applications to electret capacitor microphones is proposed (for example, see Patent Literature 6).

CITATION LIST

Patent Literature

[Patent Literature 1] Japanese Unexamined Patent Application, Publication No. 2005-529574
[Patent Literature 2] Japanese Unexamined Patent Application, Publication No. 2011-45194
[Patent Literature 3] Japanese Unexamined Patent Application, Publication No. 2012-200132
[Patent Literature 4] Japanese Unexamined Patent Application, Publication No. 2012-205465
[Patent Literature 5] Japanese Unexamined Patent Application, Publication No. 2012-120388
[Patent Literature 6] Japanese Unexamined Patent Application, Publication No. 2007-298297

SUMMARY OF INVENTION

Technical Problem

An electrostatic induction-type vibration power generation device which uses an electret forms an electrostatic capacitance when an external electric field emitted from the surface of the electret induces electric charges on counter electrodes. When a relative position between the electret and the counter electrodes is changed by an external force, the electrostatic capacitance changes. Thus, electric power can be obtained. That is, the essential factor that determines the power generation amount is the external electric field intensity that actually appears from the surface of the electret. Thus, even when some of physical parameters such as a relative permittivity of an electret material, a surface charge density, and a shape are improved, the power generation amount does not increase unless the external electric field intensity increases.

In particular, although an electret (hereinafter referred to as a "spontaneous polarization electret") which uses a spontaneous polarization of ferroelectric, pyroelectric, and piezoelectric materials has a large surface charge density, one surface thereof is positively charged and the other surface is negatively charged. In such a case, the spontaneous polarization electret is equivalent to a capacitor in which a voltage is applied across metal plates that face each other with a space interposed. Since outside the capacitor, the electric fields generated from the upper and lower charged metal plates cancel each other out, an external electric field is not generated on the surface of the spontaneous polarization electret. Thus, even when a large surface charge density is obtained on the surface of the spontaneous polarization electret, it is not possible to induce electric charges on the counter electrodes, and the spontaneous polarization electret is not ideal for an electrostatic induction-type power generation device.

For example, the thickness of a conventional electret material is between approximately 1 nm and 100 μm. When the thickness of the spontaneous polarization electret is in that range, a large portion of the electric fields generated from the surface charge is coupled inside the spontaneous polarization electret, and the amount of external electric field actually obtained is very small. Thus, even when the spontaneous polarization electret having a thickness in that range is applied to an electrostatic induction-type power generation device, the amount of electric charge induced on the counter electrodes is small and the power generation amount is also small. Therefore, it can be understood that it is difficult for the spontaneous polarization electret to achieve an equivalent power generation amount with a relatively small thickness as compared to a conventional electret material.

Moreover, for example, Patent Literature 5 discloses a general formula (Equation 1 in Patent Literature 5) that expresses a power generation amount and describes that the higher the surface charge density of a ferroelectric electret, the thicker the ferroelectric electret, and the smaller the relative permittivity, the larger the obtained power generation amount. However, the general formula is derived for a conventional electret having surface charges on one surface only, and it is questionable whether the same is satisfied for a ferroelectric electret (the same as the "spontaneous polarization electret") in which positive and negative surface charges are present in pairs on both surfaces. Thus, it is difficult to obtain a power generation amount calculated based on the general formula of Patent Literature 5.

The present invention has been made in view of the above-mentioned problems, and an object thereof is to provide an electrostatic induction-type vibration power generation device capable of improving a power generation amount, and particularly, capable of effectively extracting an external electric field from a spontaneous polarization electret and to provide a method of manufacturing the same.

Solution to Problem

In order to attain the above object, an electrostatic induction-type vibration power generation device according to the present invention includes: a pair of conductive plates containing a conductive material; the conductive plates having a gap disposed therebetween; a charged body which has a predetermined thickness, of which one surface is positively charged and the other surface is negatively charged, and which is provided between the conductive plates in contact with one of the conductive plates, wherein the gap between the conductive plates is displaced in a direction vertical to the surfaces of the charged body, whereby an electrostatic capacitance changes and electric power is generated, and the other conductive plate is disposed at a position where an absolute value of an external electric field emitted outside from the charged body is between 2.7×107 V/m and 1.5×1010 V/m.

Hereinafter, the principle of the electrostatic induction-type vibration power generation device according to the present invention will be described.

As described above, the essential parameter that determines the power generation amount of the electrostatic induction-type vibration power generation device is the magnitude of an external electric field rather than a surface charge density, a surface potential, a relative permittivity, or a shape of the electret (charged body). In particular, since one surface of the spontaneous polarization electret is positively charged and the other surface is negatively charged, and a large portion of the electric fields generated from the surface charges is coupled inside the spontaneous polarization electret, the amount of electric field emitted outside from the charged surface decreases remarkably. Thus, the present inventors constructed a model of an external electric field generated from the spontaneous polarization electret and searched for a parameter that increases the intensity thereof.

FIG. 1 illustrates parameters of a spontaneous polarization electret taken into consideration in construction of the external electric field model. In this example, an external electric field model in which a spontaneous polarization electret is substituted with a charged metal plate capacitor will be discussed. As illustrated in FIG. 1, when $\sigma$ is a surface charge density of an upper surface of the spontaneous polarization electret, $\sigma'$ is a surface charge density of a lower surface thereof, t is a thickness of the spontaneous polarization electret, L is a vertical length, W is a horizontal length, z is a distance from the center of the surface of the spontaneous polarization electret, and $\in$ is a permittivity of a medium filled around the spontaneous polarization electret, an external electric field Ez is expressed by Equation (1) below.

[Math. 1]

$$E_z = \frac{\sigma}{\pi\varepsilon}\tan^{-1}\left(\frac{(L/2)\times(W/2)}{z\sqrt{z^2+(L/2)^2+(W/2)^2}}\right)+ \frac{\sigma'}{\pi\varepsilon}\tan^{-1}\left(\frac{(L/2)\times(W/2)}{(z+t)\sqrt{(z+t)^2+(L/2)^2+(W/2)^2}}\right) \quad (1)$$

In particular, if the absolute values of the surface charge densities of the upper and lower surfaces are the same and the polarities of the electric charges are opposite, the surface charge density of the lower surface is expressed as $-\sigma$. Thus, the external electric field Ez is expressed by Equation (2) below.

[Math. 2]

$$E_z = \frac{\sigma}{\pi\varepsilon}\left(\tan^{-1}\left(\frac{(L/2)\times(W/2)}{z\sqrt{z^2+(L/2)^2+(W/2)^2}}\right) - \tan^{-1}\left(\frac{(L/2)\times(W/2)}{(z+t)\sqrt{(z+t)^2+(L/2)^2+(W/2)^2}}\right)\right) \quad (2)$$

In Equations (1) and (2), the first term represents an external electric field emitted from the upper surface of the spontaneous polarization electret and the second term represents an external electric field emitted from the lower surface. Thus, the external electric field Ez is represented by the sum thereof. As illustrated in Equations (1) and (2), the external electric field Ez increases as z decreases and $\sigma$ and t increase.

Here, when a vibration power generation device is introduced as an example, z is the distance to a counter electrode from the surface of the electret. Although z depends on the structure of the power generation device, since a conventional electrostatic induction-type power generation device, for example, aims to prevent discharge of an electret, z is set to approximately between 10 to 100 μm when the counter electrode is closest to the surface of the electret. Since $\sigma$ depends on an electret material and a polarization condition, the simplest method of increasing the external electric field Ez to increase the power generation amount is to increase the thickness t of the spontaneous polarization electret.

FIG. 2 is a graph illustrating the relation between the external electric field Ez and the thickness t of the spontaneous polarization electret. The external electric field Ez was calculated using Equation (2). The parameters used in the calculation were set such that the vertical length L was 50 mm, the horizontal length W was 50 mm, the distance z from the center of the surface of the spontaneous polarization electret was 40 μm, the evaluation was performed in an air environment, and the permittivity $\in$ was 8.9×10$^{-12}$ F/m. Moreover, the external electric field Ez was calculated for the surface charge densities $\sigma$ of 300 mC/m$^2$ (see a solid line in FIG. 2), 150 mC/m$^2$ (see a broken line in FIG. 2), and 75 mC/m$^2$ (see a dot line in FIG. 2). The surface charge density of 300 mC/m$^2$ can be obtained from a residual polarization of a ferroelectric substance which is ideally polarized completely, for example.

As illustrated in FIG. 2, it was confirmed that the external electric field Ez increases as the thickness t of the spontaneous polarization electret increases regardless of the value of the surface charge density $\sigma$. Due to this, it can be said that the external electric field can be efficiently extracted from the spontaneous polarization electret by increasing the thickness t of the spontaneous polarization electret. Moreover, it was also confirmed that the external electric field Ez saturated at the thickness of approximately 60 mm. This is because, when the thickness t of the spontaneous polarization electret approaches approximately 60 mm, the two surfaces having the surface charges of opposite polarities are sufficiently spaced from each other and the external electric field approaches that when surface charges are present on one surface only. This means that in Equation (2), the first term is sufficiently larger than the second term and the external electric field Ez is represented dominantly by the first term. Thus, although the external electric field increases as the thickness of the spontaneous polarization electret increases, the external electric field does not increase further when the thickness reaches 60 mm or more. In this case, the maximum value of the external electric field obtained from a ferroelectric substance (having a surface charge density of 300 mC/m$^2$) which is ideally polarized completely is approximately $1.5 \times 10^{10}$ V/m.

Moreover, as illustrated in Equation (2), the external electric field Ez depends on the vertical length L and the horizontal length W of the spontaneous polarization electret. When the lengths are 50 mm or smaller for applications to a driving source of small sensors or a charger of mobile devices, the external electric field Ez saturates similarly when the thickness t of the spontaneous polarization electret reaches 60 mm. Therefore, it is effective to set the thickness of the spontaneous polarization electret to 60 mm or smaller.

Moreover, the present inventors found that the power generation amount of the spontaneous polarization electret at the external electric field intensity of $2.7 \times 10^7$ V/m or more was larger than the power generation amount of the conventional electret. Moreover, it was also found that the external electric field intensity of $2.7 \times 10^7$ V/m or more can be easily attained when the thickness of the spontaneous polarization electret is 1 mm or more. From the above, it can be said that the electrostatic induction-type vibration power generation device according to the present invention can improve the power generation amount as compared to the conventional electret since the other conductive plate is disposed at a position where an absolute value of an external electric field emitted outside from the charged body is between $2.7 \times 10^7$ V/m and $1.5 \times 10^{10}$ V/m.

In the electrostatic induction-type vibration power generation device according to the present invention, the charged body may be formed by stacking a plurality of spontaneously polarized electrets having a predetermined thickness. In this case, when the negatively charged surface of one spontaneous polarization electret is stacked on the positively charged surface of the other spontaneous polarization electret so as to face the positively charged surface, the negative and positive electric charges cancel each other out at these interfaces. Thus, it is possible to manufacture a spontaneous polarization electret of which the apparent thickness is increased. Due to this, even if the surface charge density is constant before and after the spontaneous polarization electrets are stacked, since the external electric field becomes stronger as the thickness increases, it is possible to improve the power generation amount.

In the electrostatic induction-type vibration power generation device of the present invention, the charged body may be formed of arbitrary constituent materials as long as a sufficiently large external electric field intensity can be obtained with an electret of which one surface is positively charged and the other surface is negatively charged. For example, the charged body may be formed of a ferroelectric, pyroelectric, or piezoelectric material.

In the electrostatic induction-type vibration power generation device according to the present invention, the charged body may be configured to induce surface charges upon receiving compressive or tensile stress. In this case, the charged body may be used in a state of being attached to a cantilever beam or a clamped-clamped beam which is provided so as to be able to vibrate.

A method of manufacturing the electrostatic induction-type vibration power generation device according to the present invention includes: attaching a conductive member to a partial portion or an entire portion of each surface of a spontaneous polarization member having a predetermined thickness; applying an electric field to the spontaneous polarization member via the conductive members to perform a polarization process; and removing the conductive members to obtain the charged body or the spontaneously polarized electret.

According to the method of manufacturing the electrostatic induction-type vibration power generation device according to the present invention, it is possible to obtain the electrostatic induction-type vibration power generation device according to the present invention of which the power generation amount is improved.

In the electrostatic induction-type vibration power generation device according to the present invention, a conductive layer containing a conductive material may be formed in a portion of one surface of the charged body and/or a portion of the other surface. In this case, even when the conductive layer is included, it is possible to obtain a high power generation amount. Moreover, in this case, the method of manufacturing the electrostatic induction-type vibration power generation device according to the present invention preferably includes: forming the conductive layer on a portion of each surface of a spontaneous polarization member having a predetermined thickness; and applying an electric field to the spontaneous polarization member via the conductive layers to perform a polarization process to obtain the charged body. In this case, it is unnecessary to remove the conductive layer after the polarization process is performed, and a physical load on the charged body can be reduced. Thus, this manufacturing method is particularly effective for the spontaneous polarization electret that is likely to be damaged by a physical load.

Advantageous Effects of Invention

According to the present invention, it is possible to provide an electrostatic induction-type vibration power generation device capable of improving a power generation amount, and particularly, capable of effectively extracting an external electric field from a spontaneous polarization electret and to provide a method of manufacturing the same.

DESCRIPTION OF EMBODIMENTS

Figure 1:
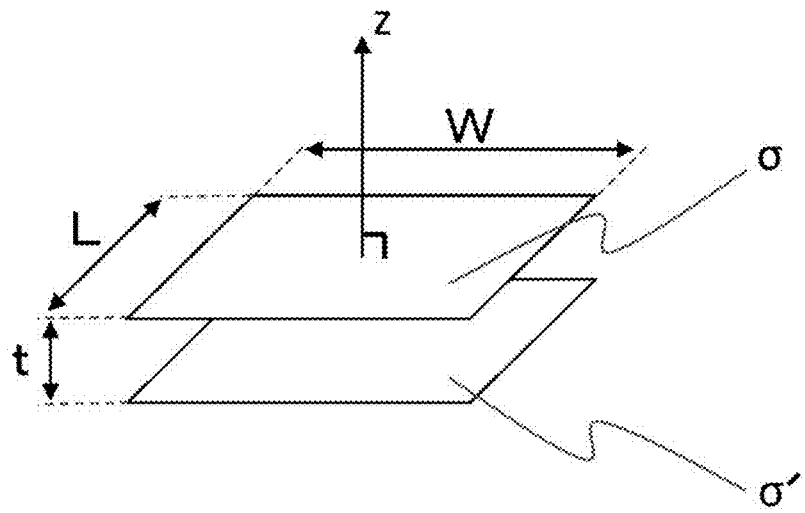
FIG. 1 is a perspective view illustrating the parameters of a spontaneous polarization electret taken into consideration in construction of an external electric field model, in relation with an electrostatic induction-type vibration power generation device according to the present invention.
Figure 2:
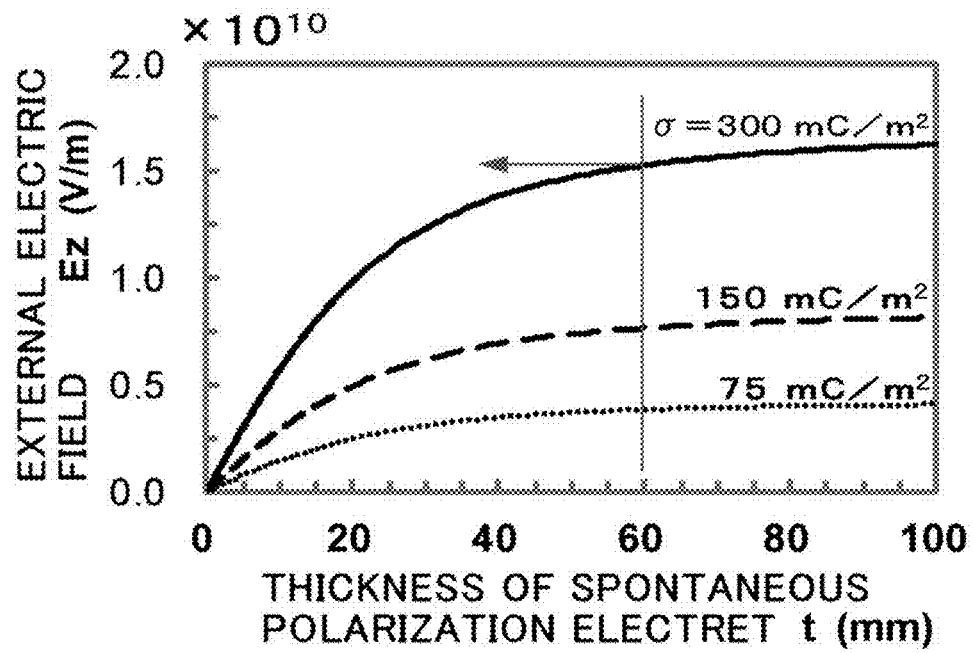
FIG. 2 is a graph illustrating the relation between an external electric field Ez and a thickness t of a spontaneous polarization electret, calculated based on the external electric field model illustrated in FIG. 1.

Hereinafter, an electrostatic induction-type power generation device and a method of manufacturing the same according to the present invention will be described with reference to the drawings and the like. In the following description of the embodiments, although the constituent elements of the device are depicted in exemplary dimensions, shapes, and positions in order to specifically illustrate the content of the present invention, the scope of the present invention is not limited thereto. Elements having the same function will be denoted by the same name or reference numerals in order to obviate redundant description thereof.

First Embodiment

FIGS. 3(a) to 3(d) illustrate a method of manufacturing a spontaneous polarization electret according to a first embodiment of the present invention. This embodiment is characterized in that, after a polarization process is performed, conductive members 4 and 5 attached to upper and lower surfaces 2 and 3 of a spontaneous polarization member 1, respectively, are removed to form a spontaneous polarization electret 6.

Figure 3:
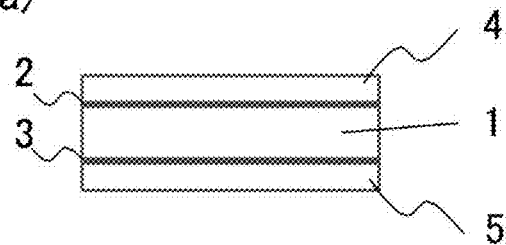
FIGS. 3(a) to 3(d) are side views illustrating a method of manufacturing a spontaneous polarization electret, in relation with a method of manufacturing an electrostatic induction-type vibration power generation device according to a first embodiment of the present invention.
Figure 3:
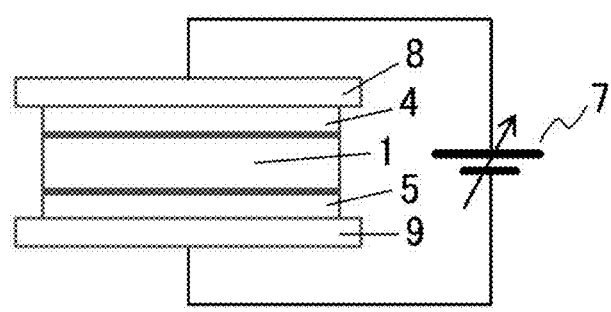
Figure 3:
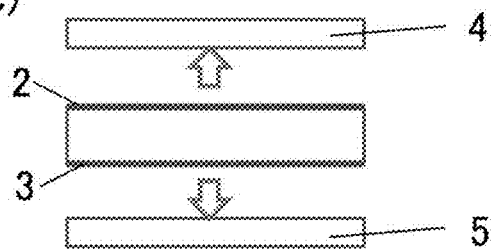
Figure 3:

First, as illustrated in FIG. 3(a), in order to improve electrical contact with a polarization processing device 7, the conductive members 4 and 5 are attached to the upper and lower surfaces 2 and 3 of the spontaneous polarization member 1, respectively. In the present embodiment, a lead zirconate titanate $Pb(Zr,Ti)O_3$-based ferroelectric ceramic (model name: C-6, manufactured by Fuji Ceramics Corporation) was used as the spontaneous polarization member 1. The lead zirconate titanate used in the present embodiment is a non-polarized lead zirconate titanate of which both surfaces are not attached to electrodes but are exposed. Moreover, a conductive copper foil tape (for example, product name: CU-18C, manufactured by Sumitomo 3M Corporation) of which the adhesive portion is formed of a conductive material having a low electrical resistance was bonded to the upper and lower surfaces 2 and 3 of the spontaneous polarization member as the conductive members 4 and 5.

Subsequently, as illustrated in FIG. 3(b), the metal plates 8 and 9 are connected to the conductive members 4 and 5, respectively, and a polarization process is performed by applying a high electric field from the polarization processing device 7. In this case, the polarization process may be performed while applying heat of 50° C. to 1200° C. within a range where the spontaneous polarization member 1 is not damaged. When using heat during the polarization, in order to prevent depolarization of the spontaneous polarization member 1, the spontaneous polarization member 1 needs to be cooled down to room temperature while keep applying the high electric field thereto and then taken out. Moreover, when the polarization process is performed in the air, if there is a possibility of discharge to occur due to application of the high electric field, the polarization process may be performed in an environment filled with gas (for example, nitrogen gas, argon gas, or sulfur hexafluoride gas) in which discharge rarely occurs rather than in the air or immersing the spontaneous polarization member 1 in silicon oil. The silicon oil may be used as a hot bath. In the present embodiment, the polarization process was performed for one hour at room temperature in a polarization electric field of 2 kV/mm or 4 kV/mm, and a bath filled with silicon oil (model name: KF-968-100CS, manufactured by Shin-Etsu Chemical Co., Ltd.).

Subsequently, as illustrated in FIG. 3(c), the conductive members 4 and 5 attached to the upper and lower surfaces 2 and 3, respectively, are removed. In the present embodiment, a conductive copper foil tape on both surfaces was removed. In this way, such a spontaneous polarization electret 6 as illustrated in FIG. 3(d) is formed of the spontaneous polarization member 1.

Figure 4:
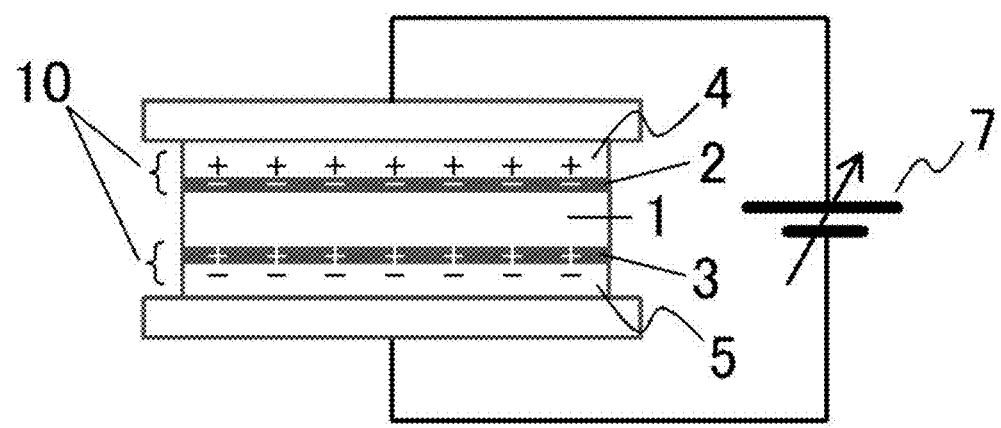
FIG. 4 is a side view illustrating a state in which an external electric field of a spontaneous polarization electret is blocked, in relation with the electrostatic induction-type vibration power generation device according to the first embodiment of the present invention.

When the conductive member(s) 4 and/or 5 remains on the entire surface of both surfaces of the spontaneous polarization member 1 after the polarization process is performed, the spontaneous polarization member 1 does not function as the spontaneous polarization electret 6. For example, when a nickel electrode was formed on both surfaces of a lead zirconate titanate according to an electroless nickel plating method and a element obtained by performing a polarization process on the lead zirconate titanate was evaluated, a large surface potential was not obtained and vibration-based power generation was not observed. Moreover, when the nickel electrodes on both surfaces were shorted across an electrical resistor, the measured surface potential was zero. This is considered to be attributable to the following fact. As illustrated in FIG. 4, exchange of electric charges occurs between the conductive members 4 and 5 via the polarization processing device 7, and an interfacial electric double layer 10 is formed in the interface between the upper surface 2 and the conductive member 4 and the interface between the lower surface 3 and the conductive member 5. As a result, an external electric field emitted from the surface charges of the spontaneous polarization member 1 is blocked. Thus, the spontaneous polarization electret 6 of the present embodiment is characterized in that the conductive members 4 and 5, which were on the upper and lower surfaces 2 and 3, respectively, are omitted.

Next, evaluation results of a vibration-based power generation property of the spontaneous polarization electret 6 of the present embodiment will be described. In this power generation evaluation, since the electric power generated from the negatively charged surface was evaluated, the negatively charged surface will be defined as a "front side".

Table 1 illustrates the relation among the thickness t of Elements 1 to 6 of the spontaneous polarization electret 6 used in the power generation evaluation, the polarization electric field intensity $E_{Poling}$ (kV/mm) applied to the spontaneous polarization member 1 during the polarization process, the surface potential $V_{S-}$ (V) on the negatively charged front side, the surface potential $V_{S+}$ (V) on the rear side, the relative permittivity $\epsilon_r$ of the electret material, and the effective surface charge density $\sigma$ (mC/m²) on the negatively charged front side. The conventional electret was also evaluated for comparison. Here, the conventional electret was obtained by implanting negative charges onto a 10-μm-thick CYTOP polymer film (registered trademark, product name: CTL-809M, manufactured by Asahi Glass Co., Ltd.) spin-coated on a copper board using a corona discharging method. The surface potential was measured using a non-contact surface potential meter (model name: MODEL 344, manufactured by TREK JAPAN). The effective surface charge density $\sigma$ was calculated by $\epsilon_r \cdot \epsilon_o \cdot V_{S-}/t$. Here, $\epsilon_o$ is the vacuum permittivity. The electret used in the present embodiment had a vertical length L of 20 mm and a horizontal length W of 20 mm. Since Elements 1 and 2 of the spontaneous polarization electret 6 had a thickness of 0.1 mm and was likely to break, a conductive member was not attached thereto and was subjected to the polarization process in the air.

TABLE 1

|  | t (mm) | $E_{Poling}$ (kV/mm) | $V_{S-}$ (V) | $V_{S+}$ (V) | $\epsilon_r$ | $\sigma$ (mC/m²) |
|---|---|---|---|---|---|---|
| Conventional | 0.01 | — | −559 | 0 | 2.1 | −1.0 |
| Element 1 | 0.1 | 2 | −28 | +33 | 2605 | −6.5 |
| Element 2 | 0.1 | 4 | −51 | +51 | 2605 | −12 |
| Element 3 | 0.5 | 2 | −122 | +121 | 2274 | −4.9 |
| Element 4 | 0.5 | 4 | −210 | +230 | 2274 | −8.5 |
| Element 5 | 1.0 | 2 | −254 | +268 | 2348 | −5.3 |
| Element 6 | 1.0 | 4 | −589 | +583 | 2348 | −12 |

As illustrated in Table 1, the surface potential on the rear side of the conventional electret was zero whereas the surface potentials of the opposite polarities and approximately the same magnitudes were measured for Elements 1 to 6 of the spontaneous polarization electret 6. This means that the electret which uses a spontaneous polarization of a ferroelectric substance is formed properly. Moreover, since the surface charge density increases when a polarization electric field applied in the polarization process is increased, an increase in the polarization electric field intensity is effective in further improving the power generation amount.

Figure 5:
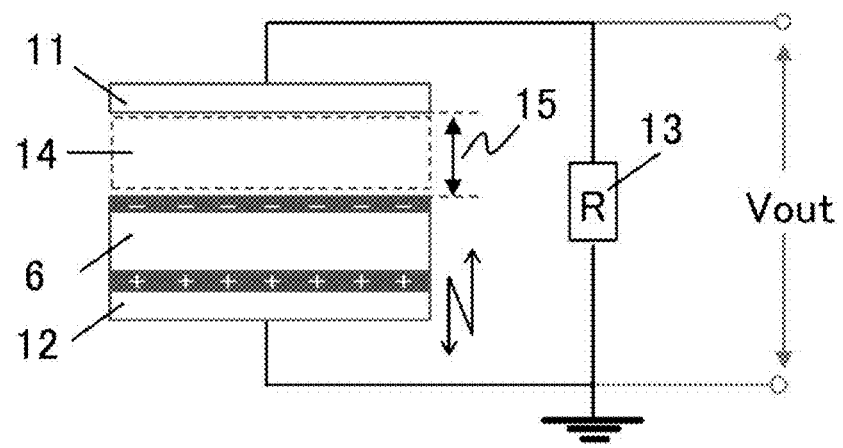
FIG. 5 is a side view illustrating the structure of the electrostatic induction-type vibration power generation device according to the first embodiment of the present invention.

FIG. 5 illustrates a structure of a device used for evaluating vibration-based power generation. An upper electrode 11 is fixed to the air by a support (not illustrated) and a lower electrode 12 is fixed onto an exciter (not illustrated). The upper electrode 11 and the lower electrode 12 are electrically connected with a load 13 interposed, and the lower electrode 12 is further connected to the ground. In the spontaneous polarization electret 6 or the conventional electret, a negative charged surface is provided on and in contact with the lower electrode 12 so as to face the upper electrode 11 and forms an electrostatic capacitance between the negatively charged surface and the upper electrode 11 with a space 14 interposed. Here, the distance from the negatively charged surface of the electret to the surface of the upper electrode 11 will be referred to as an air gap 15. When a vibration is applied from the exciter, the air gap 15 between the upper electrode 11 and the electret on the lower electrode 12 is displaced in a direction vertical to the charged surface of the electret, and the electrostatic capacitance changes. In this way, an electric current flows across the load 13 and the electret can be used as a power generation device. This power generation evaluation was performed in the air, the initial air gap 15 before excitation was set to 0.35 mm, and the excitation conditions were set such that the frequency was 20 Hz and the acceleration was 4.9 m/s². Moreover, the power generation amount P was calculated according to Equation (3) below. Here, $V_{OUT}$ is an output voltage appearing across the load 13, R is an impedance of the load 13, and T is a measurement period.

[Math. 3]

$$P = \frac{1}{T}\int_0^T \frac{V_{out}^2}{R} dt \quad (3)$$

Figure 6:
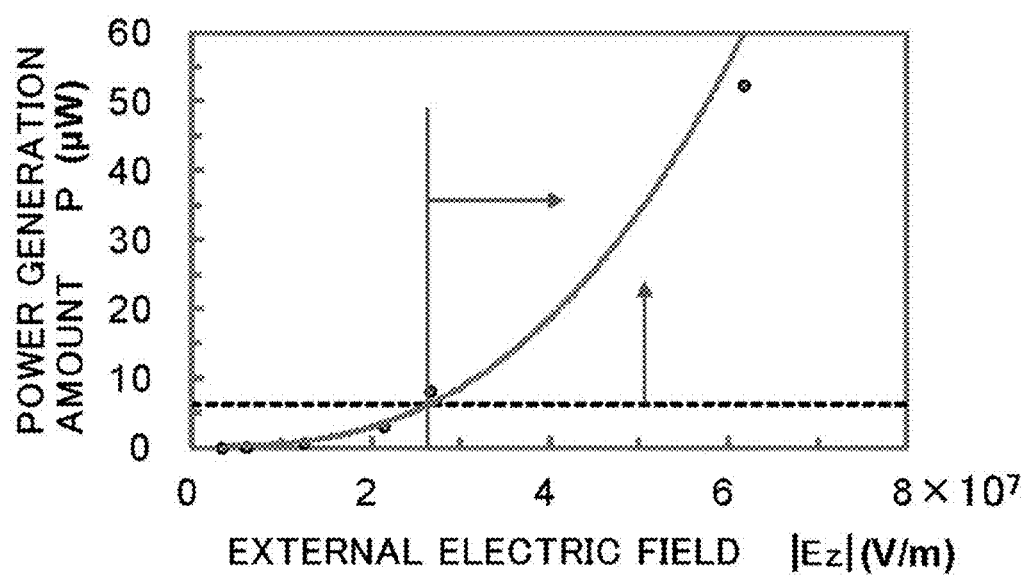
FIG. 6 is a graph illustrating the relation between a power generation amount of a spontaneous polarization electret device and an external electric field intensity, in relation with the electrostatic induction-type vibration power generation device according to the first embodiment of the present invention.

FIG. 6 illustrates the relation between the power generation amounts of Elements 1 to 6 of the spontaneous polarization electret 6 described in Table 1 and the external electric field intensity calculated using Equation (2). In general, although the external electric field intensity depends on the size of the air gap 15, the larger the absolute value of the external electric field intensity, the higher the obtained power generation amount. In this example, the external electric field intensity was calculated by defining the thickness and the effective surface charge density described in Table 1 and z as the air gap of the vibration center 0.35 mm and substituting the same into Equation (2). Moreover, the power generation amount was calculated from Equation (3)

by connecting an impedance-matched load R that maximizes the power generation amount. The optimal load R was approximately 30.5 MΩ for the spontaneous polarization electret and was approximately 50.5 MΩ for the conventional electret. In FIG. 6, a dotted line indicates the power generation amount of the conventional electret.

As illustrated in FIG. 6, it can be understood that the power generation amount increases exponentially as the external electric field intensity becomes stronger (that is, the surface charge density and the thickness increase). Thus, an increase in the thickness as well as an increase in the surface charge density of the spontaneous polarization electret 6 is effective in improving the power generation amount. Here, when the power generation amounts of the conventional electret and the spontaneous polarization electret 6 were compared, it was confirmed that the power generation amount of the spontaneous polarization electret 6 exceeded the power generation amount of the conventional electret at the external electric field intensity of $2.7 \times 10^7$ V/m or more. Moreover, it was understood that the external electric field intensity was easily attained when the thickness of the spontaneous polarization electret 6 was 1 mm or more. Thus, the thickness of the spontaneous polarization electret 6 is preferably 1 mm or more. Moreover, as described above, since the external electric field intensity saturates at the thickness of 60 mm, the thickness of the spontaneous polarization electret 6 is ideally set to between 1 mm and 60 mm.

In the present embodiment, a lead zirconate titanate ceramic which is an inorganic ferroelectric material was used as the spontaneous polarization member 1. However, the findings of the present invention can naturally be applied regardless of the constituent material and the degree of crystallinity thereof as long as a sufficiently large external electric field intensity can be obtained with an electret of which one surface is positively charged and the other surface is negatively charged. Thus, the same result can be obtained with other ferroelectric, pyroelectric, and piezoelectric materials formed of inorganic or organic materials, for example. Moreover, the findings of the present invention can be applied to a substance obtained by from a dielectric rubber filled with a filler consisting of ferroelectric, pyroelectric, and piezoelectric materials, an organic ferroelectret formed by electrically charging a foamed polymer film, a multiferroic material having both ferromagnetic and ferroelectric properties, and a solid electrolytic material such as silver iodide. Further, the above-mentioned may be in the form of monocrystal, polycrystal, and amorphous, and a mixture thereof.

Moreover, the findings of the present invention can be effectively applied when an electric charge density of the spontaneous polarization electret 6 has a distribution in the thickness direction thereof. This is because, as in the present embodiment, by measuring the surface potential using a surface potential meter which uses a non-contact probe to calculate the effective surface charge density, an external electric field generated from a spontaneous polarization electret having an electric charge density distribution can be reproduced from the effective surface charge density and the external electric field model of the present invention. Further, in the present embodiment, although an external electric field generated from the spontaneous polarization electret 6 having a square surface of which the vertical and horizontal lengths are the same has been discussed, the findings of the present invention can be effectively applied to other shapes such as a rectangular shape or a polygonal shape. This is because, when a certain shape is regarded to be a set of very small rectangles, the external electric field model of the present invention illustrated in Equations (1) and (2) can be applied. Thus, when the surface charge density and the thickness of the individual very small rectangles are increased, the external electric field emitted from the entire shape increases.

Further, in the present embodiment, the conductive copper foil tape having an adhesive portion which has a low resistance was used for the conductive members 4 and 5, but the same result can be obtained with a material of which the electrical resistance is 1 mΩ·cm or smaller and which can be removed after the polarization process. For example, a method of applying a paste material such as gold, silver, copper, carbon, or the like, a method of forming a thin film of a transparent oxide, a carbon nanotube, a graphene, a conductive polymer, or the like on the surface according to a coating method, and a doped semiconductor substrate may be used.

In the present embodiment, although the space 14 is filled with air, the space may be degassed by packaging to create a vacuum state and may be filled with inert gas. Moreover, the space may be filled with a dielectric material that is easily expanded and contracted. Further, a protective film formed of an inorganic or organic substance may be formed on the surface of the spontaneous polarization member 1 or the spontaneous polarization electret 6 in order to prevent adsorption of moisture or other substances into the surface of the spontaneous polarization electret 6. Examples of the inorganic protective film include a silicon oxide film, a silicon nitride film, a silicon oxynitride film, and laminates thereof. Examples of the organic protective film include hexamethyldisilazane (HMDS), a fluorine-based resin, and the like. When the protective film is formed on the spontaneous polarization member 1, the thickness of the protective film may be set to between 100 nm and 10 μm so that the polarization electric field does not decrease during the polarization process while preventing adsorption of moisture and other substances.

Second Embodiment

This embodiment relates to a method of manufacturing the spontaneous polarization electret 6 in a simple manner and is characterized in that, the conductive member(s) 4 and/or 5 remains in a portion of the upper surface 2 and/or the lower surface 3 of the spontaneous polarization electret 6. FIGS. 7(a) to 7(d) illustrate a method of manufacturing the spontaneous polarization electret 6 according to the second embodiment of the present invention. The manufacturing method used in the first embodiment is also effective in the present embodiment, and the description of the portions overlapping those of the first embodiment will be provided briefly.

Figure 7:
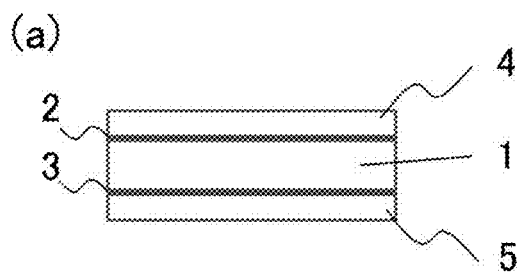
FIGS. 7(a) to 7(d) are side views illustrating a method of manufacturing a spontaneous polarization electret, in relation with a method of manufacturing an electrostatic induction-type vibration power generation device according to a second embodiment of the present invention.
Figure 7:
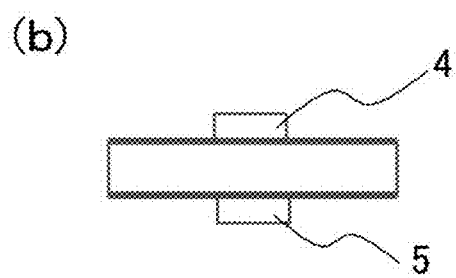
Figure 7:
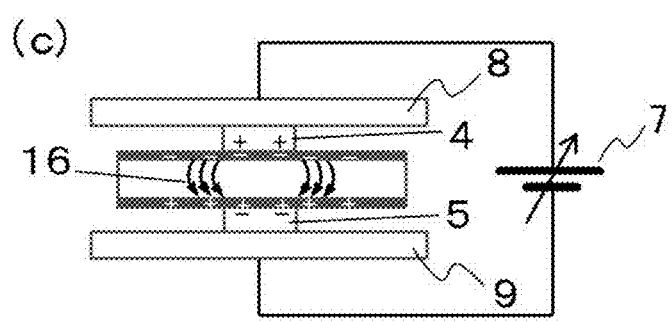
Figure 7:
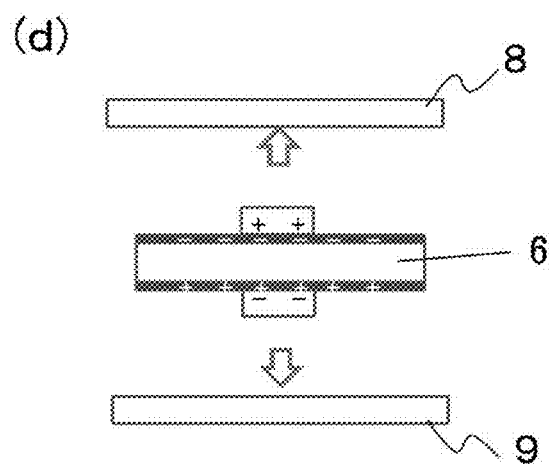

First, as illustrated in FIG. 7(a), the conductive members 4 and 5 are formed on the upper and lower surfaces 2 and 3 of the spontaneous polarization member 1, respectively. In the present embodiment, a conductive film which has a low resistance is formed on the upper and lower surfaces 2 and 3 of the spontaneous polarization member 1 according to deposition, sputtering, chemical vapor deposition, coating, printing, plating, or the like, for example.

Subsequently, as illustrated in FIG. 7(b), the conductive member(s) 4 and/or 5 is processed into an island shape. In the present embodiment, a resist pattern is created on the surface of the conductive member(s) 4 and/or 5 according to a photolithography process and the surface is processed in an island shape according to a wet-etching method. Alternatively, an anti-corrosion mask is attached to the surface of the conductive member(s) 4 and/or 5 and the surface is processed into an island shape according to a dry-etching method. After that, the resist pattern or the anti-corrosion mask is removed. In this case, a portion of the spontaneous polarization member 1 outside the pattern may be etched.

Subsequently, as illustrated in FIG. 7(c), the metal plates 8 and 9 are connected to the conductive members 4 and 5, respectively, and a polarization process is performed by applying a high electric field from the polarization processing device 7. In this case, although an interfacial electric double layer is formed immediately below the conductive members 4 and 5 processed into the island shape, surface charges are induced in a portion in which the upper surface 2 and/or the lower surface 3 is exposed. This is because a fringe electric field 16 is generated in the spontaneous polarization member 1 via the conductive members 4 and 5 processed into the island shape to accelerate polarization in the portion in which the upper and lower surfaces 2 and 3 are exposed.

After that, as illustrated in FIG. 7(d), the metal plates 8 and 9 are removed, and the spontaneous polarization electret 6 of the second embodiment is formed. As compared to the first embodiment, the present embodiment can eliminate the step of removing the conductive members 4 and 5 after the polarization process is performed and can reduce the physical load on the spontaneous polarization electret 6 element. This manufacturing method is particularly effective for the spontaneous polarization electret 6 that is likely to be damaged by a physical load.

In the present embodiment, although patterning is performed according to a wet-etching method or a dry-etching method after the conductive members 4 and 5 are formed, the island shape may be formed using a laser beam, a shot blasting method, a dicing method, and the like. Moreover, the pattern of the conductive members may be formed directly using a screen printing method, a gravure printing method, a die-coating method, an inkjet printing method, an offset printing method, a flexographic printing method, and the like. Further, a heat treatment step may be added before and after the polarization process in order to cure the element after the island shape processing step. When a heat treatment step is added after the polarization process, the step may be performed in a temperature range in which depolarization of the spontaneous polarization electret 6 does not occur.

Third Embodiment

This embodiment relates to a method of manufacturing the spontaneous polarization electret 6 and provides means for increasing the thickness of the spontaneous polarization electret 6 to improve a vibration-based power generation amount with a simple method. From the model of the external electric field generated from the spontaneous polarization electret 6 as described above, it can be understood that, the external electric field enhances with increasing the thickness of the spontaneous polarization electret 6, leading to higher power generation. However, the polarization process requires a larger voltage as the thickness of the spontaneous polarization electret 6 increases. For example, a polarization voltage of 2 kV was applied at the thickness of 1 mm for the lead zirconate titanate used in the first embodiment. However, in order to realize the same polarization with an element having a thickness of 10 mm, the polarization processing device 7 capable of applying a high voltage of 20 kV is required, which is undesirable from the perspective of manufacturing cost and stability.

Thus, in the present embodiment, the spontaneous polarization electrets (for example, the spontaneous polarization electrets 6 of the first embodiment) are stacked to increase an apparent thickness. This spontaneous polarization electret has one surface that is positively charged and another surface that is negatively charged. In this case, for example, when the negatively charged surface of one spontaneous polarization electret is stacked on the positively charged surface of the other spontaneous polarization electret so as to face the positively charged surface, the negative and positive electric charges cancel each other out at these interfaces. Thus, it is possible to manufacture the spontaneous polarization electret 6 of which the apparent thickness is increased. Due to this, even if the surface charge density is constant before and after the spontaneous polarization electrets are stacked, the external electric field becomes stronger as the thickness increases and the power generation amount is improved. An examination result of the power generation amount of the spontaneous polarization electret 6 of the present embodiment will be discussed below.

In the present embodiment, the relation between the power generation amount and the stacking of the spontaneous polarization electret was examined using the same spontaneous polarization material 1, the same manufacturing method, and the same evaluation method as those of the first embodiment. Table 2 illustrates the relation among the thickness t (mm) of the spontaneous polarization electret element used in the present embodiment, the surface potential $V_{S-}$ (V) on the negatively charged front side, the surface potential $V_{S+}$ (V) on the positively charged rear side, and the effective surface charge density $\sigma$ (mC/m$^2$) on the negatively charged front side. The polarization electric field was 2 kV/mm and the relative permittivity was 2348. Here, in Table 2, a sample in which Element Y was stacked on Element X was denoted by Element Y/X. The spontaneous polarization electrets were stacked so that the negatively charged front side and the positively charged rear side were in contact at the interface. As illustrated in Table 2, by stacking spontaneous polarization electrets, it is possible to increase the thickness while maintaining the surface charge density at a constant.

TABLE 2

|  | t (mm) | $V_{S-}$ (V) | $V_{S+}$ (V) | $\sigma$ (mC/m$^2$) |
| --- | --- | --- | --- | --- |
| Element 7 | 1.0 | −292 | +292 | −6.1 |
| Element 8 | 1.0 | −288 | +286 | −6.0 |
| Element 9 | 1.0 | −290 | +284 | −6.1 |
| Element 7/8 | 2.0 | −583 | +579 | −6.1 |
| Element 7/8/9 | 3.0 | −896 | +825 | −6.2 |

Figure 8:
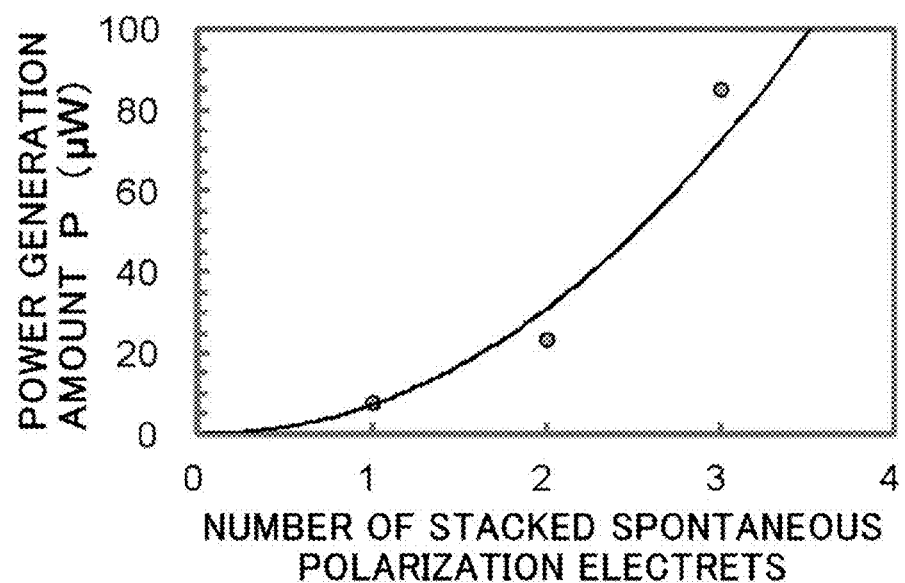
FIG. 8 is a graph illustrating the relation between a power generation amount and the number of stacked spontaneous polarization electrets, in relation with an electrostatic induction-type vibration power generation device according to a third embodiment of the present invention.

Next, FIG. 8 illustrates the relation between the power generation amount and the number of stacked spontaneous polarization electrets for three elements Element 7, Element 7/8, and Element 7/8/9. The optimal load for the spontaneous polarization electret 6 that is experimentally investigated was 30.5 MΩ. The same vibration condition and air gap as those used for the evaluation of the first embodiment were used. As illustrated in FIG. 8, it can be understood that the power generation amount increases exponentially as the number of stacked spontaneous polarization electrets increases. This means that, when the apparent thickness is increased, the external electric field intensity becomes stronger and the power generation amount is improved. According to the present embodiment, it is possible to improve the power generation amount with simple means.

In the present embodiment, although spontaneous polarization electrets having the same surface charge density and thickness were manufactured in order to verify the effects of stacking, the power generation amount can also be improved by stacking spontaneous polarization electrets having different surface charge densities and thicknesses. Moreover, the same effects can be obtained by stacking the spontaneous polarization electrets manufactured according to the manufacturing method of the second embodiment. Further, the interfaces between spontaneous polarization electrets may be attached using an adhesive such as a thin epoxy resin and a conductive paste.

Fourth Embodiment

This embodiment provides means for inducing positive and negative surface charges on the surfaces of a piezoelectric material by employing a structure that applies compressive or tensile stress to the piezoelectric material so that the material functions as the spontaneous polarization electret 6. First, the principle thereof will be described.

In this example, an aluminum nitride (AlN) material having the Wurtzite structure is used as an example of a piezoelectric material and the surface charge density is predicted when stress is applied to the piezoelectric material. For example, when compressive stress is applied to such a material, a spontaneous polarization amount ($\delta P_3$) in the c-axis direction is expressed by the following equation.

$$\delta P_3 = e_{33}\in_3 + e_{31}(\in_1 + \in_2)$$

Here, $e_{33}$ and $e_{31}$ are piezoelectric constants, and $\in_1$, $\in_2$, and $\in_3$ are distortions in the a, b, and c-axis directions and are expressed by $\in_i = (\in_i - \in_{i0})/\in_{i0}$. $\in_i$ is the length of each crystal lattice when compressive stress is applied, and $\in_{i0}$ is the length of each crystal lattice in an equilibrium state before stress is applied. The parameters used in calculation were set such that $\in_{1O}$ was 0.311 nm, $\in_{2O}$ was 0.311 nm, $\in_{3O}$ was 0.498 nm, the volume was 0.0417 nm$^3$, $e_{33}$ was 1.55 C/m$^2$, and $e_{31}$ was −0.58 C/m$^2$.

For example, when the c-axis was expanded by 0.5% by compressive stress while maintaining the volume to be constant, the induced surface charge density was 10.7 mC/m$^2$. Thus, since a sufficiently large surface charge density was obtained, the piezoelectric material can function as the spontaneous polarization electret 6.

Figure 9:
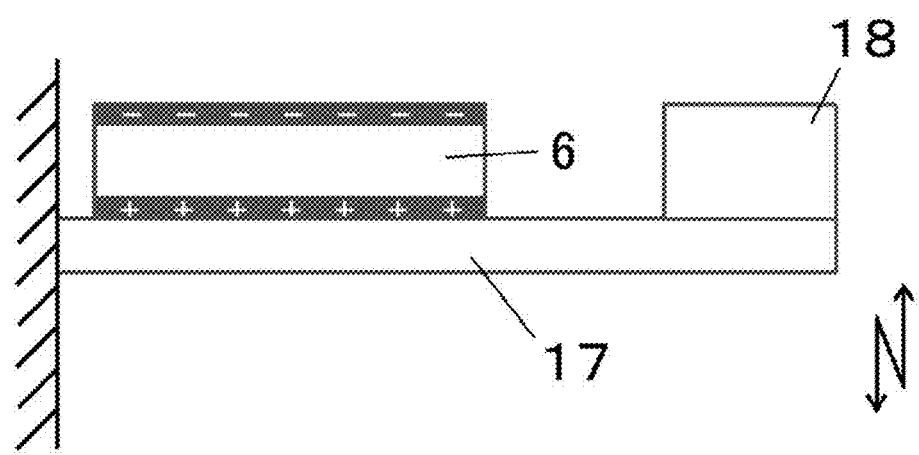
FIG. 9 is a side view illustrating a spontaneous polarization electret having a cantilever beam structure, in relation with an electrostatic induction-type vibration power generation device according to a fourth embodiment of the present invention.
Figure 10:
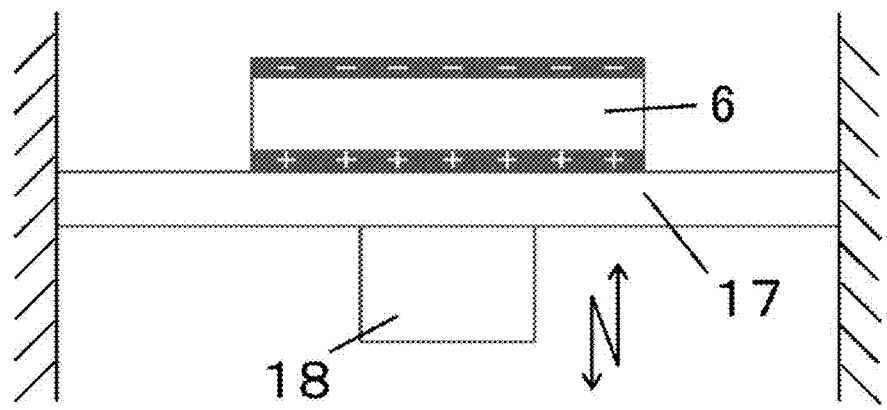
FIG. 10 is a side view illustrating a spontaneous polarization electret having a clamped-clamped beam structure, in relation with an electrostatic induction-type vibration power generation device according to a fourth embodiment of the present invention.

FIGS. 9 and 10 illustrate the structure of the spontaneous polarization electret 6 according to the present embodiment. FIG. 9 illustrates a cantilever beam 19 in which one end of a substrate 17 is fixed and a mass 18 is provided at the other end, and which has a structure in which a spontaneous polarization electret 6 formed of a piezoelectric material is attached to the substrate 17 by an epoxy resin, a conductive paste, or the like, for example. When external force or acoustic pressure is applied to the cantilever beam 19, the cantilever beam 19 vibrates, and the spontaneous polarization electret 6 provided on the cantilever beam 19 receives compressive and tensile stress alternately. In this way, surface charges are induced in the spontaneous polarization electret 6.

FIG. 10 illustrates a clamped-clamped beam 20 in which both ends of a substrate 17 are fixed and a mass 18 is provided at the center of the substrate 17 and which has a structure in which the spontaneous polarization electret 6 is attached to the clamped-clamped beam 20. By the same principle as the cantilever beam 19, the clamped-clamped beam 20 vibrates and surface charges are induced in the spontaneous polarization electret 6. The substrates 17 of the cantilever beam 19 and the clamped-clamped beam 20 are preferably formed of a flexible material. Examples of the flexible material include a metallic foil material such as an SUS material, a copper alloy material, or an aluminum alloy material and a flexible polymer substrate material such as polyethylene naphthalate (PEN), polyethylene terephthalate (PET), polycarbonate (PC), polyethersulfone (PES), or polyimide (PI). Moreover, a composite material of these materials may be used.

In the present embodiment, although the spontaneous polarization electret 6 may be manufactured according to the manufacturing methods of the first to third embodiments, when the spontaneous polarization electret 6 is formed of a poly- or single-crystalline highly-oriented piezoelectric material, the polarization process may be omitted. Examples of the highly-oriented piezoelectric material include zinc oxides, manganese and/or magnesium-doped zinc oxides, aluminum nitrides, scandium-doped aluminum oxides, and the like.

Fifth Embodiment

This embodiment relates to a power generation device for applications to a driving source of small sensors or a charger of mobile devices, and more particularly, to a power generation device which uses a vibration vertical to the charged surface of the spontaneous polarization electret 6. Hereinafter, in the present embodiment, such a vibration will be referred to as a vertical vibration.

Figure 11:
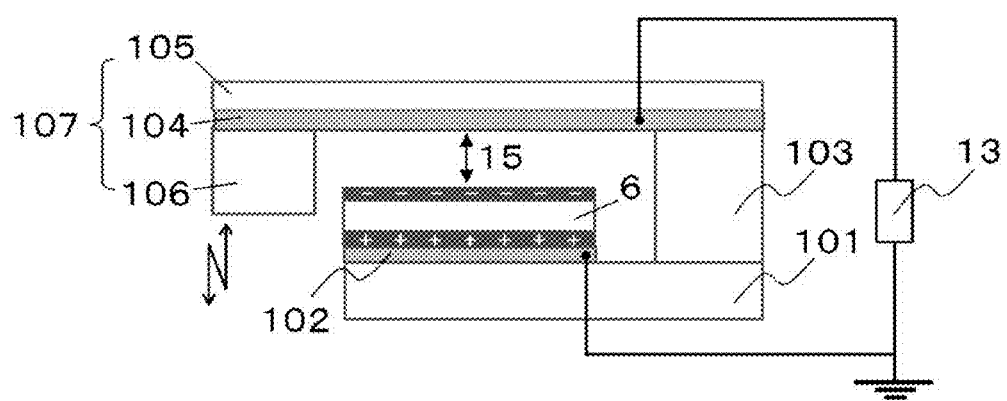
FIG. 11 is a side view illustrating an electrostatic induction-type vibration power generation device having a cantilever beam structure according to a fifth embodiment of the present invention.

FIG. 11 illustrates a power generation device 100 of the present invention, which includes a lower substrate 101, a lower conductive layer 102, a spacer 103, an upper conductive layer 104, an upper substrate 105, a mass 106, a spontaneous polarization electret 6, and a load 13. The spontaneous polarization electret 6 is provided on the lower conductive layer 102, and the upper conductive layer 104 and the lower conductive layer 102 are electrically connected with the load 13 interposed. When external force, acoustic pressure, or the like is applied and a vertical vibration occurs in the power generation device 100, a cantilever beam 107 formed of the upper conductive layer 104, the upper substrate 105, and the mass 106 vibrates and an air gap 15 is displaced. In this case, the electrostatic capacitance formed between the lower conductive layer 102 and the upper conductive layer 104 with the spontaneous polarization electret 6 interposed changes, whereby an electric current flows across the load 13. In this way, electric power can be generated similarly to the first embodiment.

Figure 12:
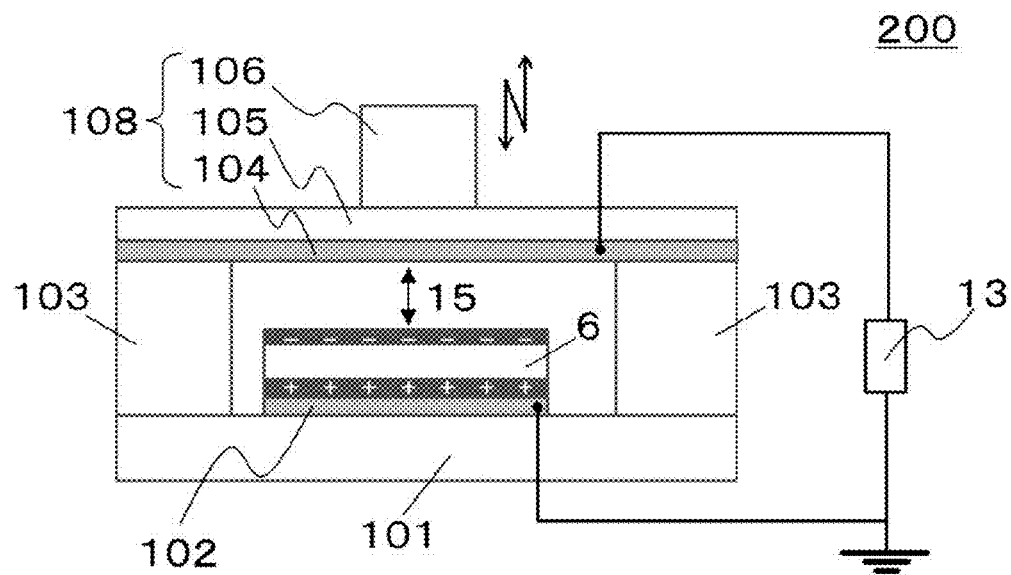
FIG. 12 is a side view illustrating an electrostatic induction-type vibration power generation device having a clamped-clamped beam structure according to the fifth embodiment of the present invention.

FIG. 12 illustrates a vertical vibration-based power generation device 200 according to the present embodiment, which includes a lower substrate 101, a lower conductive layer 102, a spacer 103, an upper conductive layer 104, a upper substrate 105, a mass 106, the spontaneous polarization electret 6, and a load 13. This power generation device 200 is characterized in that, as compared to the power generation device 100, a clamped-clamped beam 108 formed of the upper conductive layer 104, the upper substrate 105, and the mass 106 is displaced, whereby electric power is generated. By the same principle as the power generation device 100, when a vertical vibration occurs in the power generation device 200, the clamped-clamped beam 108 vibrates, and the air gap 15 between the upper conductive layer 104 and the spontaneous polarization electret 6 is displaced, whereby electric power is generated.

Since the cantilever beam 107 and the clamped-clamped beam 108 provides an improved power generation amount as the displacement of the air gap 15 increases, the upper substrate 105 is preferably formed of a flexible material. Examples of the flexible material include a metallic foil material, a flexible printed wiring board material, an extremely thin glass material, a polymer flexible substrate material, silicon, and the like. It is also preferable to process the upper substrate 105 into an appropriate shape using a dry-etching method, a wet-etching method, a laser beam, a shot blasting method, a dicing method, and the like so that a large displacement occurs at a designed vibration frequency.

Moreover, a metallic foil material and a polymer flexible substrate material is particularly preferable because these materials provide excellent long-term mechanical durability. Examples of the metallic foil material include SUS materials, copper alloy materials, nickel alloy materials, titanium alloy materials, aluminum alloy materials, and composite materials thereof. Moreover, examples of the polymer flexible substrate materials include polyethylene naphthalate (PEN), polyethylene terephthalate (PET), polycarbonate (PC), polyethersulfone (PES), polyimide (PI), cycloolefin polymer (COP), Teflon (registered trademark) (PTFE), fluoroethylene propylene (FEP), CYTOP (registered trademark), polymethylmethacrylate (PMMA), SU-8 epoxy resin materials, parylene, and composite materials obtained by attaching these materials using a resin.

Moreover, when the lower substrate 101 and the upper substrate 105 are formed of a low resistance material having a low electrical resistance of 1 mΩ·cm or smaller, the lower conductive layer 102 and the upper conductive layer 104 may be omitted. The upper conductive layer 104 and the lower conductive layer 102 are formed of a material having an electrical resistance of 1 mΩ·cm or smaller according to deposition, sputtering, chemical vapor deposition, coating, plating, or the like. A coating method is particularly preferable as an inexpensive method. For example, a thin film of gold, silver, copper, carbon, transparent oxides, carbon nanotube, graphene, conductive polymers, or the like may be formed according to a spin coating method, a screen printing method, a gravure printing method, a die-coating method, an inkjet printing method, an offset printing method, a flexographic printing method, and the like.

Further, mass 106 may receive attractive or repulsive force from magnetic or electrostatic fields in order to increase the displacement of the upper substrate 105 and thus the power generation amount. That is, when magnetic force is used, a magnet may be provided immediately above and/or below the mass 106 and a partial portion or an entire portion of the mass 106 may be formed of a magnetic material or a magnet. When electrostatic force is used, an electret may be provided immediately above and/or below the mass 106 and a partial portion or an entire portion of the mass 106 may be formed of an electret. By using such a mechanism, it is possible to obtain a large power generation amount from vertical vibration.

Sixth Embodiment

This embodiment relates to a vertical vibration-based power generation device for applications to a driving source of small sensors or a charger of mobile devices, and more particularly, to a power generation device having the structure of the fourth embodiment in which the spontaneous polarization electret 6 is a piezoelectric material. The structure and material of the portions denoted by the same reference numerals as the fifth embodiment are effective in the present embodiment, and redundant description thereof will be provided briefly.

Figure 13:
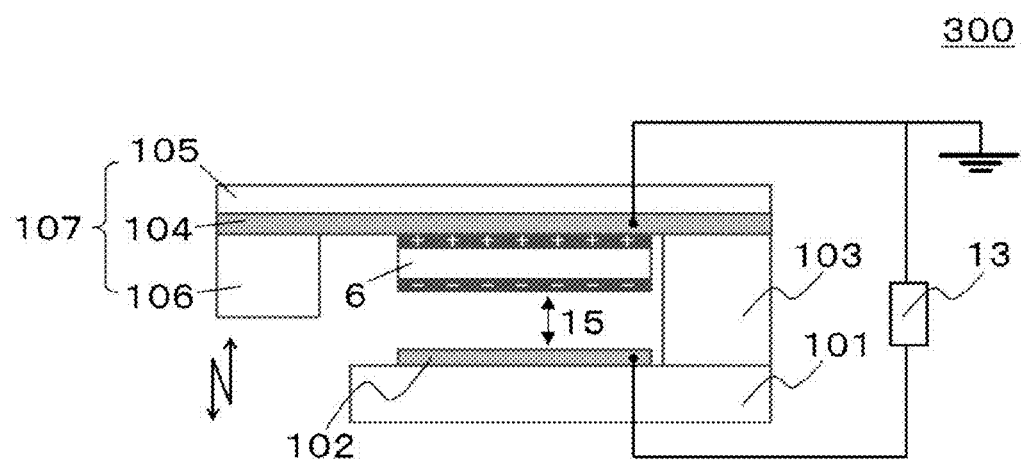
FIG. 13 is a side view illustrating an electrostatic induction-type vibration power generation device having a cantilever beam structure according to a sixth embodiment of the present invention.

FIG. 13 illustrates a power generation device 300 of the present embodiment, which includes a lower substrate 101, a lower conductive layer 102, a spacer 103, an upper conductive layer 104, an upper substrate 105, a mass 106, a spontaneous polarization electret 6, and a load 13. The spontaneous polarization electret 6 is provided on the side of a cantilever beam 107 formed of the upper conductive layer 104, the upper substrate 105, and the mass 106. When external force, acoustic pressure, or the like is applied and a vertical vibration occurs in the power generation device 300, the cantilever beam 107 vibrates, and the air gap 15 is displaced. In this case, compressive and tensile stresses are alternately applied to the spontaneous polarization electret 6, and surface charges depending on the strength of the stress are induced, thereby emitting an external electric field to the lower conductive layer 102 and thus forming an electrostatic capacitance. The electrostatic capacitance formed between the lower conductive layer 102 and the upper conductive layer 104 with the spontaneous polarization electret 6 interposed changes, whereby an electric current flows across the load 13. In this way, vibration-based power generation can occur using the spontaneous polarization electret 6 of the fourth embodiment.

Figure 14:
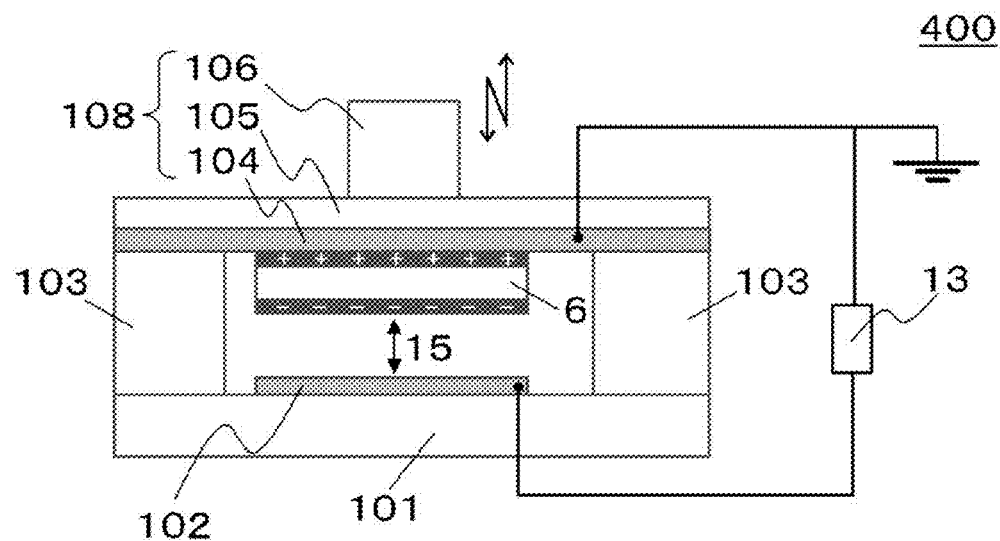
FIG. 14 is a side view illustrating an electrostatic induction-type vibration power generation device having a clamped-clamped beam structure according to the sixth embodiment of the present invention.

FIG. 14 illustrates a power generation device 400 of the present invention, which includes a lower substrate 101, a lower conductive layer 102, a spacer 103, an upper conductive layer 104, an upper substrate 105, a mass 106, a spontaneous polarization electret 6, and a load 13. The spontaneous polarization electret 6 is provided on the side of a clamped-clamped beam 108 formed of the upper conductive layer 104, the upper substrate 105, and the mass 106. This power generation device 400 is characterized in that, as compared to the power generation device 300, the clamped-clamped beam 108 is displaced to generate electric power.

Seventh Embodiment

This embodiment relates to a vertical vibration-based power generation device for applications to a driving source of small sensors or a charger of mobile devices, and is characterized in that the power generation device employs two vibration systems to improve the power generation amount. The structure and material of the portions denoted by the same reference numerals as the fifth and sixth embodiments are effective in the present embodiment, and redundant description thereof will be provided briefly.

Figure 15:
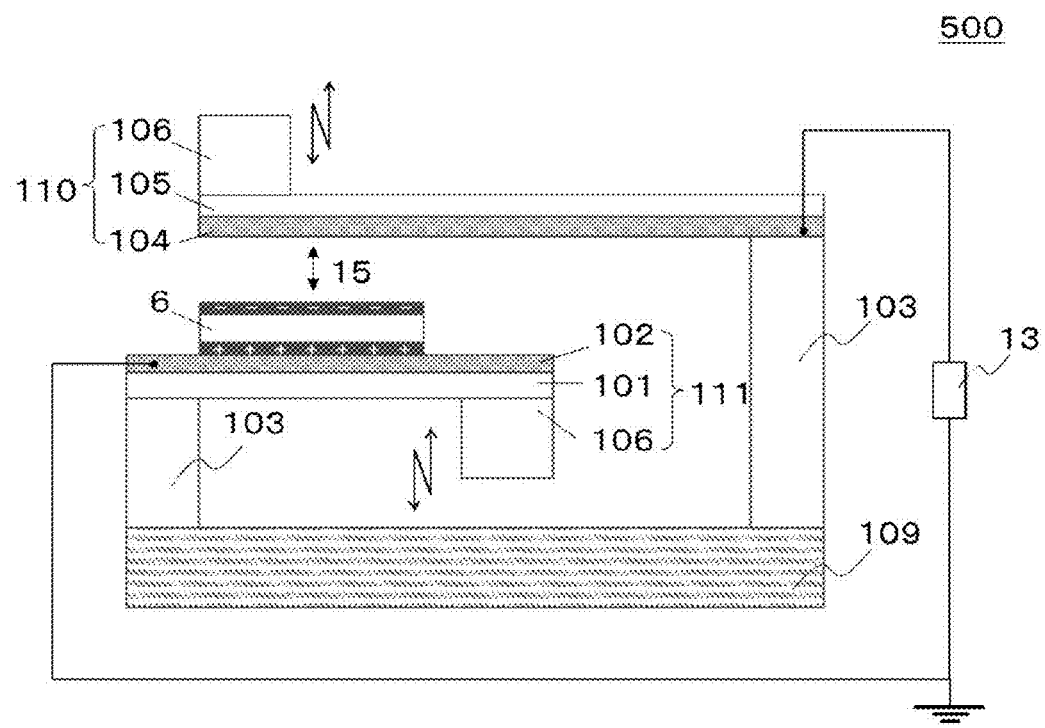
FIG. 15 is a side view illustrating an electrostatic induction-type vibration power generation device having a cantilever beam structure according to a seventh embodiment of the present invention.

FIG. 15 illustrates a power generation device 500 of the present embodiment, which includes a support substrate 109, a lower substrate 101, a lower conductive layer 102, a spacer 103, an upper conductive layer 104, an upper substrate 105, a mass 106, a spontaneous polarization electret 6, and a load 13. Moreover, the power generation device 500 includes a first vibration system 110 having a cantilever beam structure, formed of the upper conductive layer 104, the upper substrate 105, and the mass 106 and a second vibration system 111 having a cantilever beam structure, formed of the lower substrate 101, the lower conductive layer 102, and the mass 106. When external force, acoustic pressure, or the like is applied and a vertical vibration occurs in the power generation device 500, the first vibration system 110 having the cantilever beam structure and the second vibration system 111 having the cantilever beam structure vibrate. At this time, in the present embodiment, since two vibration systems are provided individually, the air gap 15 is displaced more largely. Due to this, the change in the electrostatic capacitance formed between the lower conductive layer 102 and the upper conductive layer 104 with the spontaneous polarization electret 6 interposed increases. Thus, the electric current flowing in the load 13 increases, and the power generation amount is improved.

Figure 16:
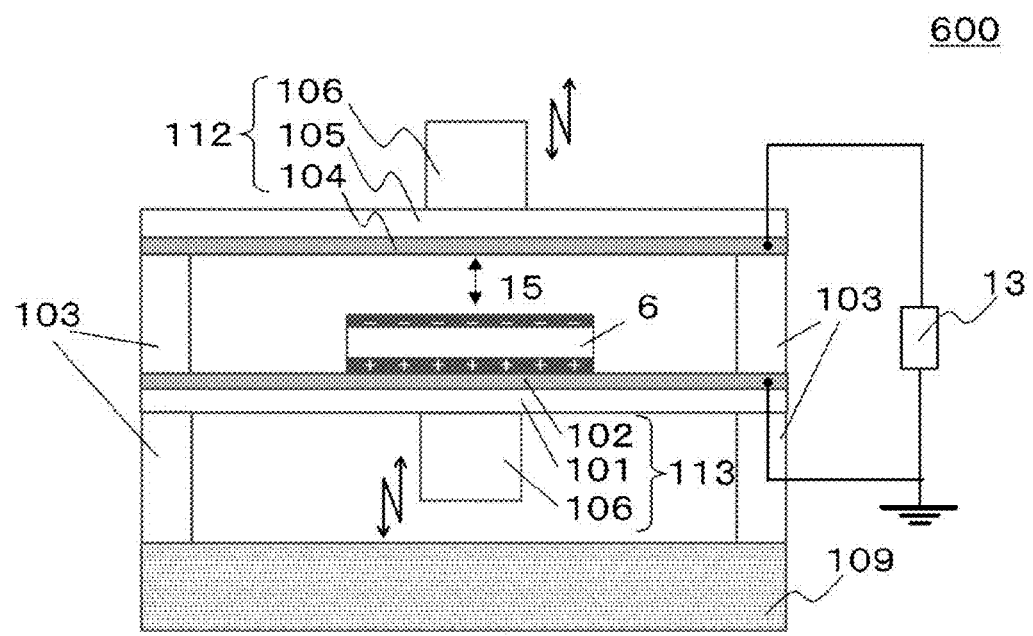
FIG. 16 is a side view illustrating an electrostatic induction-type vibration power generation device having a clamped-clamped beam structure according to the seventh embodiment of the present invention.

FIG. 16 illustrates a power generation device 600 of the present embodiment, which includes a support substrate 109, a lower substrate 101, a lower conductive layer 102, a spacer 103, an upper conductive layer 104, an upper substrate 105, a mass 106, a spontaneous polarization electret 6, and a load 13. The power generation device 600 is different from the power generation device 500 in that the power generation device 600 includes a first vibration system 112 having a clamped-clamped beam structure, formed of the upper conductive layer 104, the upper substrate 105, and the mass 106 and a second vibration system 113 having a clamped-clamped beam structure, formed of the lower substrate 101, the lower conductive layer 102, and the mass 106. By using such a structure, it is possible to obtain a larger power generation amount.

INDUSTRIAL APPLICABILITY

The spontaneous polarization electret of the present invention and the electrostatic induction-type vibration power generation device using the same can be applied as a driving source of microphones, temperature-humidity sensors, pressure sensors, acceleration sensors, seismometers, or wireless devices, and as a charger of display devices or mobile electronic appliances.

REFERENCE SIGNS LIST

1: Spontaneous polarization member
2: Upper surface
3: Lower surface
4: Conductive member
5: Conductive member
6: Spontaneous polarization electret
7: Polarization processing device
8: Metal plate
9: Metal plate
10: Interfacial electric double layer
11: Upper electrode
12: Lower electrode
13: Load
14: Space
15: Air gap
16: Fringe electric field
17: Substrate
18: Mass
19: Cantilever beam
20: Clamped-clamped beam
100: Power generation device
101: Lower substrate
102: Lower conductive layer
103: Spacer
104: Upper conductive layer
105: Upper substrate
106: Mass
107: Cantilever beam
108: Clamped-clamped beam
109: Support substrate
110: First vibration system having cantilever beam structure
111: Second vibration system having cantilever beam structure
112: First vibration system having clamped-clamped beam structure
113: Second vibration system having clamped-clamped beam structure
200: Power generation device
300: Power generation device
400: Power generation device
500: Power generation device
600: Power generation device

The invention claimed is:

1. An electrostatic induction-type vibration power generation device comprising:
    a pair of conductive plates containing a conductive material, a gap disposed between the conductive plates, and the conductive plates including a first conductive plate and a second conductive plate;
    a charged body which has a predetermined thickness, of which one surface is positively charged and the other surface is negatively charged, and which is provided between the conductive plates in contact with the first conductive plate, wherein
    the gap between the conductive plates is displaced in a direction vertical to the surfaces of the charged body, whereby an electrostatic capacitance changes and electric power is generated,
    the thickness of the charged body is between 1 mm and 60 mm,
    the charged body is formed of a spontaneously polarized electret, and
    the second conductive plate is disposed at a position where an absolute value of an external electric field emitted from the charged body is between $2.7 \times 10^7$ V/m and $1.5 \times 10^{10}$ V/m.

2. The electrostatic induction-type vibration power generation device according to claim 1, wherein
    the charged body is formed by stacking a plurality of spontaneously polarized electrets having a predetermined thickness.

3. The electrostatic induction-type vibration power generation device according to claim 1, wherein
    the charged body is formed of ferroelectric, pyroelectric, or piezoelectric material.

4. The electrostatic induction-type vibration power generation device according to claim 1, wherein
    the charged body is configured to induce surface charges upon receiving compressive or tensile stress.

5. The electrostatic induction-type vibration power generation device according to claim 1, wherein
    a conductive layer containing a conductive material is formed in a portion of one surface of the charged body and/or a portion of the other surface of the charged body.

6. A method of manufacturing the electrostatic induction-type vibration power generation device according to claim 1, comprising:
    attaching a conductive member to a partial portion or an entire portion of each surface of a spontaneous polarization member having a predetermined thickness;
    applying an electric field to the spontaneous polarization member via the conductive members to perform a polarization process; and
    removing the conductive members to obtain the charged body.

7. The method of manufacturing the electrostatic induction-type vibration power generation device according to claim 5, comprising:
   forming the conductive layer on a portion of each surface of a spontaneous polarization member having a predetermined thickness; and
   applying an electric field to the spontaneous polarization member via the conductive layers to perform a polarization process to obtain the charged body.

* * * * *